United States Patent
Park

(10) Patent No.: US 10,143,096 B2
(45) Date of Patent: Nov. 27, 2018

(54) ROLLABLE DISPLAY DEVICE

(71) Applicant: Samsung Display Co., Ltd., Yongin-si, Gyeonggi-do (KR)

(72) Inventor: Dong Jin Park, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/724,893

(22) Filed: Oct. 4, 2017

(65) Prior Publication Data
US 2018/0103551 A1  Apr. 12, 2018

(30) Foreign Application Priority Data
Oct. 6, 2016 (KR) .................. 10-2016-0129071

(51) Int. Cl.
| | | |
|---|---|---|
| H05K 5/00 | (2006.01) | |
| H05K 5/02 | (2006.01) | |
| F16H 1/20 | (2006.01) | |
| G06F 1/16 | (2006.01) | |
| G09F 9/30 | (2006.01) | |

(52) U.S. Cl.
CPC ............ H05K 5/0017 (2013.01); F16H 1/20 (2013.01); G06F 1/1652 (2013.01); G09F 9/301 (2013.01); H05K 5/0217 (2013.01)

(58) Field of Classification Search
CPC .. H05K 5/0017; H05K 5/0217; G06F 1/1652; F16H 1/20; G09F 9/301
See application file for complete search history.

(56) References Cited

U.S. PATENT DOCUMENTS

| | | | |
|---|---|---|---|
| 8,001,711 B2* | 8/2011 | LaFarre | G02F 1/167 |
| | | | 40/515 |
| 9,098,241 B1* | 8/2015 | Cho | H05K 1/028 |
| 9,244,494 B2* | 1/2016 | Hinson | G06F 15/025 |
| 9,348,369 B2 | 5/2016 | Kee et al. | |
| 9,733,672 B2* | 8/2017 | Kim | G06F 1/1652 |
| 9,743,537 B2* | 8/2017 | Kim | G06F 1/1652 |
| 9,760,129 B2* | 9/2017 | Kim | G06F 1/1656 |
| 9,940,892 B2* | 4/2018 | Pang | G09G 5/00 |
| 2005/0040962 A1* | 2/2005 | Funkhouser | G06F 1/1601 |
| | | | 340/815.4 |

(Continued)

FOREIGN PATENT DOCUMENTS

| | | |
|---|---|---|
| KR | 10-1186969 | 9/2012 |
| KR | 10-2016-0057046 A | 5/2016 |
| KR | 10-2016-0067272 A | 6/2016 |

*Primary Examiner* — Hoa C Nguyen
*Assistant Examiner* — Keith Depew
(74) *Attorney, Agent, or Firm* — Innovation Counsel LLP

(57) ABSTRACT

Provided is a rollable display device including a rotatable roller, a fixing portion surrounding the roller and including a first slit, a rotating portion surrounding the fixing portion and including a second slit, a gear assembly transferring torque of the roller to the rotating portion so that a rotation direction of the rotating portion is opposite to a rotation direction of the roller, and a flexible display panel. The gear assembly includes a plurality of gears installed in the roller, the fixing portion and the rotating portion. The flexible display panel includes a first area positioned between the roller and the fixing portion of which one end is fixed to the roller, a second area positioned to pass through the first slit, and a third area extended from the second area.

20 Claims, 14 Drawing Sheets

(56) References Cited

U.S. PATENT DOCUMENTS

| | | | | |
|---|---|---|---|---|
| 2007/0241002 A1* | 10/2007 | Wu | ............... | G06F 1/1601 |
| | | | | 206/150 |
| 2012/0050075 A1* | 3/2012 | Salmon | ............ | G06F 1/1626 |
| | | | | 341/20 |
| 2015/0268914 A1* | 9/2015 | Kim | ............ | G06F 3/1423 |
| | | | | 345/1.3 |
| 2015/0340004 A1* | 11/2015 | Pang | ............ | G09G 5/00 |
| | | | | 345/205 |
| 2016/0029474 A1* | 1/2016 | Cho | ............ | H05K 1/028 |
| | | | | 361/749 |
| 2016/0054758 A1* | 2/2016 | Han | ............ | G06F 1/1652 |
| | | | | 361/679.26 |
| 2016/0120023 A1* | 4/2016 | Choi | ............ | H05K 1/028 |
| | | | | 361/749 |
| 2016/0135284 A1* | 5/2016 | Choi | ............ | G09F 9/301 |
| | | | | 361/749 |
| 2016/0187929 A1* | 6/2016 | Kim | ............ | G06F 1/1652 |
| | | | | 345/184 |
| 2017/0023978 A1* | 1/2017 | Cho | ............ | H04M 1/0268 |
| 2017/0031387 A1* | 2/2017 | Kim | ............ | G06F 1/1652 |
| 2017/0196102 A1* | 7/2017 | Shin | ............ | G01R 33/072 |

\* cited by examiner

ROLLABLE DISPLAY DEVICE

RELATED APPLICATIONS

This application claims priority to and the benefit of Korean Patent Application No. 10-2016-0129071 filed in the Korean Intellectual Property Office on Oct. 6, 2016, the entire contents of which are incorporated herein by reference.

BACKGROUND

1. Field

The described technology relates generally to a rollable display device, and more particularly, to a structure of a roller assembly on which a flexible display panel is wound.

2. Description of the Related Art

With respect to display devices, there has been an increased interest in display devices that are easily moved and stored as well as an interest in larger and clearer display devices. A flexible display panel is a display panel in which a plurality of pixels is disposed on a flexible substrate such as a plastic film other than a rigid substrate and also is easily bendable.

Recently, a rollable display device using the flexible display panel, a foldable display device, an expandable display device, and the like have been developed. Among display devices, when the rollable display device is used, the flexible display panel is widely unfolded to enhance visibility, and when the rollable display device is moved and stored, the flexible display panel is wound around a roller to enhance portability.

The flexible display panel is formed by a multilayered structure including a plurality of films with an adhesion layer interposed therebetween. In the case where the flexible display panel is wound around the roller in one direction (clockwise or counterclockwise), as the number of winding times (the number of rolling turns) is increased, a phenomenon in which one film is pushed against the other film by deformation of the adhesive layer may occur.

Since the relative pushing between the films is accumulated at an end of the flexible display panel, the plurality of films may be misaligned at the end of the flexible display panel. In this case, defects such as peeling and cracks may be generated at the end of the flexible display panel.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a rollable display device for preventing defects such as peeling and cracks from being generated at the end of the flexible display panel by minimizing relative pushing between films by rolling of the flexible display panel.

An example embodiment provides a rollable display device including a roller configured to be rotatble, a fixing portion surrounding the roller and including a first slit, a rotating portion surrounding the fixing portion and including a second slit, a gear assembly including a plurality of gears installed in the roller, the fixing portion, and the rotating portion, wherein the plurality of gears is configured to transfer torque of the roller to the rotating portion, and a flexible display panel. The flexible display panel includes a first area positioned between the roller and the fixing portion of which one end is fixed to the roller, a second area positioned to pass through the first slit, and a third area extended from the second area.

The first area may be wound around the roller in a first direction and the first slit may have an arc shape on a cross section, and. A bending direction of the second area passing through the first slit may be opposite to a bending direction of the first area based on a first inflection point. In a received mode in which the flexible display panel is received in the rotating portion, the third area may be wound between the fixing portion and the rotating portion in a second direction that is opposite to the first direction.

The fixing portion may include a first end that is convex and a second end that is concave, the second end facing the first end with the first slit interposed therebetween on the cross section. A thickness of the fixing portion measured on the cross section may be gradually increased toward the second end in a circumferential direction from the first end.

A rotation direction of the rotating portion may be the same as a rotation direction of the roller and a rotation distance of the rotating portion may be the same as a rotation distance of the roller. The gear assembly may include a first gear formed on an outer surface of the roller in a circumferential direction of the roller, a second gear installed in the fixing portion and engaging with the first gear, a third gear installed in the fixing portion and engaging with the second gear, and a fourth gear formed on an inner surface of the rotating portion in a circumferential direction of the rotating portion and engaging with the third gear.

A gear ratio of the first gear and the second gear may be 1:1 and a gear ratio of the second gear and the third gear may be 1:1. A gear ratio of the first gear and the fourth gear may be the same as a radius ratio of the first gear and the fourth gear.

Another example embodiment provides a rollable display device including a rotatable roller, a rotating portion surrounding the roller and including a third slit, a fixing portion surrounding the rotating portion and including a fourth slit, a gear assembly including a plurality of gears installed in the roller, the rotating portion and the fixing portion, wherein the plurality of gears is configured to transfer torque of the roller to the rotating portion, and a flexible display panel. The flexible display panel may include a first area positioned between the roller and the rotating portion of which one end is fixed to the roller, a second area positioned to pass through the third slit, and a third area extended from the second area.

The first area may be wound around the roller in a first direction and the third slit may have an arc shape on a cross section. A bending direction of the second area passing through the third slit may be opposite to a bending direction of the first area based on a first inflection point. In a received mode in which the flexible display panel is received in the fixing portion, the third area may be wound between the rotating portion and the fixing portion in a second direction that is opposite to the first direction.

The rotating portion may include a first end that is convex and a second end that is concave, the second end facing the first end with the third slit interposed therebetween on the cross section. A thickness of the rotating portion measured on the cross section may be gradually increased toward the second end in a circumferential direction from the first end.

A rotation direction of the rotating portion may be opposite to a rotation direction of the roller and a rotation distance of the rotating portion may be the same as a rotation distance of the roller. The gear assembly may include a first gear formed on an outer surface of the roller in a circumferential direction of the roller, a second gear installed in the rotating portion and engaging with the first gear, a third gear installed in the rotating portion and engaging with the second gear, and a fourth gear formed on an inner surface of the fixing portion in a circumferential direction of the fixing portion and engaging with the third gear.

A gear ratio of the first gear and the second gear may be 1:1 and a gear ratio of the second gear and the third gear may be 1:1. A gear ratio of the first gear and the fourth gear may be the same as a radius ratio of the first gear and the fourth gear. Yet another example embodiment provides a rollable display device including a rotatable roller, a first receiving portion surrounding the roller and including a fifth slit, a second receiving portion surrounding the first receiving portion and including a sixth slit, a gear assembly including a plurality of gears installed in the roller, the first receiving portion and the second receiving portion, wherein the plurality of gears is configured to transfer torque of the roller to any one of the first receiving portion and the second receiving portion, and a flexible display panel. The flexible display panel includes a first area positioned between the roller and the first receiving portion of which one end is fixed to the roller, a second area positioned to pass through the fifth slit, and a third area extended from the second area.

The first area may be wound around the roller in a first direction and the fifth slit may have an arc shape on a cross section. A bending direction of the second area passing through the fifth slit may be opposite to a bending direction of the first area based on a first inflection point. In a received mode in which the flexible display panel is received in the second receiving portion, the third area may be wound between the first receiving portion and the second receiving portion in a second direction which is opposite to the first direction.

The first receiving portion may include a first end that is convex and a second end that is concave facing the first end with the fifth slit interposed therebetween on the cross section. A thickness of the first receiving portion measured on the cross section may be gradually increased toward the second end in a circumferential direction from the first end.

The first receiving portion may be configured to maintain a fixed position, the gear assembly may be configured to may transfer torque of the roller to the second receiving portion, and a rotation direction of the second receiving portion may be the same as a rotation direction of the roller.

On the other hand, the second receiving portion may be configured to maintain a fixed position, the gear assembly may be configured to transfer torque of the roller to the first receiving portion, and a rotation direction of the first receiving portion may be opposite to a rotation direction of the roller.

The flexible display panel is formed by a multilayered film structure. According to the exemplary embodiments, since the flexible display panel includes the first area and the third area which are wound in opposite directions to each other, in the first area and the third area, relative pushing between the films is offset from each other. Therefore, a phenomenon in which the films are misaligned from each other at the end of the flexible display panel may not occur and defects such as peeling and cracks may be prevented.

DETAILED DESCRIPTION

Figure 1:
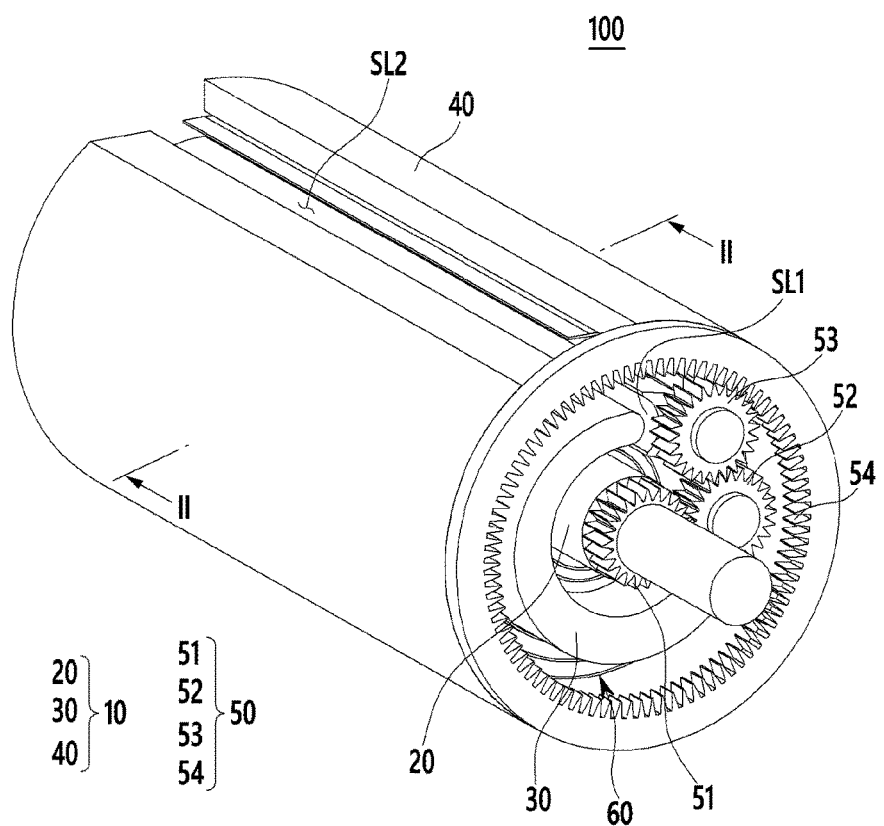
FIG. 1 is a perspective view illustrating a received mode of a rollable display device according to a first exemplary embodiment.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present disclosure is not limited thereto. In the drawings, the thickness of layers, films, panels, regions, etc., are exaggerated for clarity. In the drawings, for understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, in the specification, the word "on" means positioning on or below the object portion, but does not essentially mean positioning on the upper side of the object portion based on a gravity direction.

In addition, unless explicitly described to the contrary, the word "comprise" and variations such as "comprises" or "comprising", will be understood to imply the inclusion of stated elements but not the exclusion of any other elements. Further, in this specification, the word "on a plane" means viewing a target portion from the top, and the word "on a cross section" means viewing a cross section vertically cutting a target portion from the side.

Figure 2:
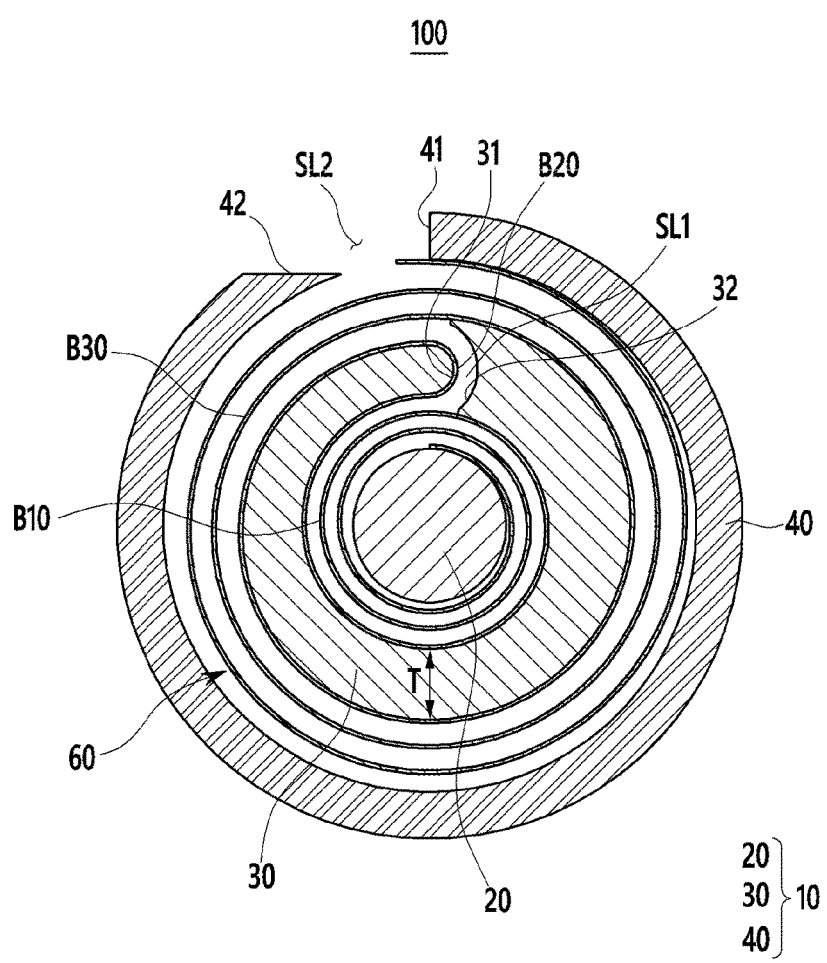
FIG. 2 is a cross-sectional view of the rollable display device taken along line II-II of FIG. 1.

FIG. 1 is a perspective view illustrating a received mode of a rollable display device according to a first exemplary embodiment. FIG. 2 is a cross-sectional view of the rollable display device taken along line II-II of FIG. 1 and FIG. 3 is a front view of the rollable display device illustrated in FIG. 1.

Figure 3:
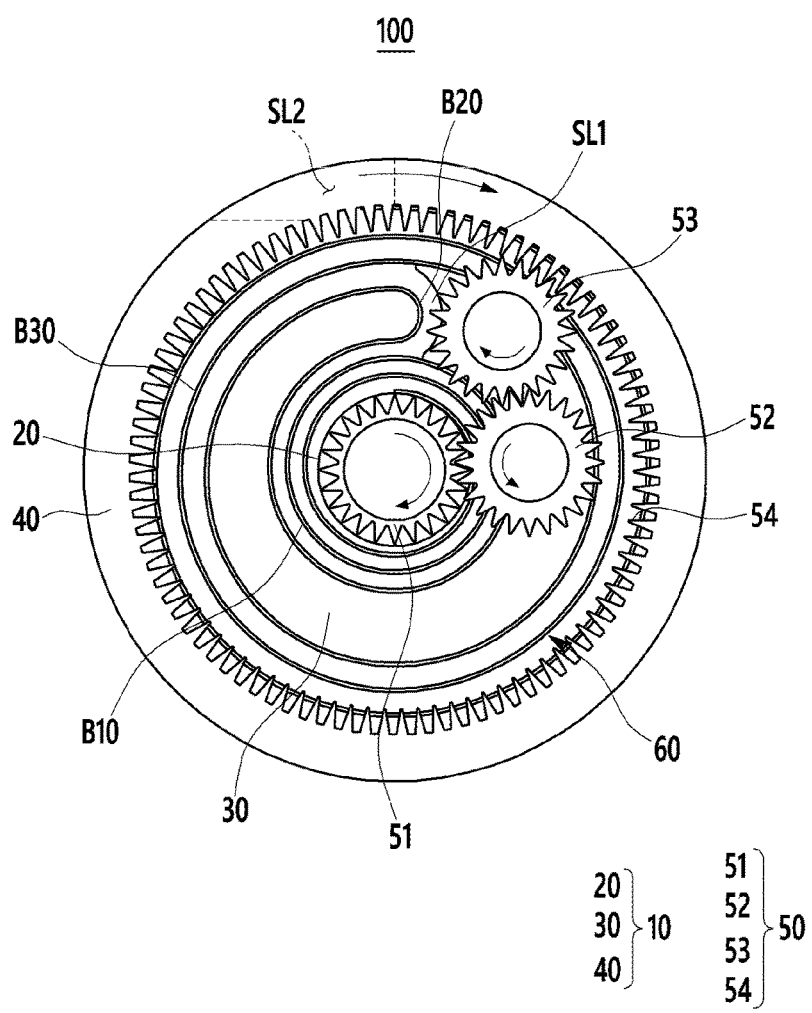
FIG. 3 is a front view of the rollable display device illustrated in FIG. 1.

Referring to FIGS. 1 to 3, a rollable display device 100 of the first exemplary embodiment includes a roller assembly 10 and a flexible display panel 60 coupled to the roller assembly 10.

The roller assembly 10 includes a rotatable roller 20, a fixing portion 30 surrounding the roller 20 at a predetermined distance from the roller 20, a rotating portion 40 surrounding the fixing portion 30 at a predetermined distance from the fixing portion 30, and a gear assembly 50 rotating the rotating portion 40 by transferring torque of the roller 20 to the rotating portion 40. A state where the flexible display panel 60 is accommodated in the rotating portion 40 may be defined as a received mode.

The roller 20 may have a predetermined diameter and a rotary knob or a rotary motor (not illustrated) may be coupled to one end of the roller 20. When the user turns the rotary knob or the rotary motor is operated, the roller 20 rotates in one direction (a clockwise or counterclockwise direction).

The fixing portion 30 is a cylindrical member surrounding the roller 20 and maintaining a fixed position. The fixing portion 30 includes a first slit SL1 which is parallel with an axial direction of the roller 20. The first slit SL1 is an opening passing through the fixing portion 30 in a radius direction. On a cross section, the first slit SL1 may be an arc shape and the fixing portion 30 may have a thickness T (see FIG. 2) which is gradually changed in a circumferential direction.

For example, on the cross section, the fixing portion 30 may include a first end 31 which is convex and a second end 32 which is concave facing the first end 31 with the first slit SL1 interposed therebetween. In addition, the thickness T of the fixing portion 30 measured on the cross section may be gradually increased toward the second end 32 in the circumferential direction from the first end 31. An inner surface of the fixing portion 30 is spaced apart from the roller 20 and an outer surface of the fixing portion 30 is spaced apart from an inner surface of the rotating portion 40.

The rotating portion 40 is a cylindrical member surrounding the fixing portion 30 and rotates by linking with the roller 20 when the roller 20 rotates. On the cross section, a rotation center of the rotating portion 40 (about which the rotating portion 40 rotates) coincides with a rotation center of the roller 20 (about which the roller 20 rotates). The rotating portion 40 includes a second slit SL2 which is parallel with an axial direction of the roller 20. The second slit SL2 is an opening passing through the rotating portion 40 in a radius direction and serves as an outlet of the flexible display panel 60.

On the cross section, the rotating portion 40 may include a third end 41 which is parallel with a radius direction and a fourth end 42 which is parallel with a reference surface, for example, a ground surface on which the roller assembly 10 is placed. The second slit SL2 is positioned between the third end 41 and the fourth end 42.

The gear assembly 50 transfers torque of the roller 20 when the roller 20 rotates to the rotating portion 40 to rotate the rotating portion 40. In this case, a rotation direction of the rotating portion 40 may be the same as a rotation direction of the roller 20—circumferentially speaking—and a rotation distance of the rotating portion 40 may be the same as a rotation distance of the roller 20 when the rotating portion 40 and roller 20 are both in rotation, for some given amount of rotation time. The 'rotation distance' used in this specification means a distance where one point of a rotation object rotates in the circumferential direction of the rotation object.

For example, the gear assembly 50 may include a first gear 51 installed on an outer surface of the roller 20, a second gear 52 and a third gear 53 installed in the fixing portion 30, and a fourth gear 54 installed on the inner surface of the rotating portion 40.

The first gear 51 includes a plurality of gear teeth arranged in the circumferential direction of the roller 20 from one side of the roller 20. The second gear 52 engages with the first gear 51 and the third gear 53 engages with the second gear 52. The fourth gear 54 engages with the third gear 53 and includes a plurality of gear teeth arranged in the circumferential direction of the rotating portion 40 from one side of the rotating portion 40.

A gear ratio of the first gear 51 and the second gear 52 may be 1:1 and a gear ratio of the second gear 52 and the third gear 53 may be 1:1. In this case, the rotation direction of the second gear 52 is opposite to the rotation direction of the first gear 51 and the rotation direction of the third gear 53 is the same as the rotation direction of the first gear 51. In addition, the rotation distance of the second gear 52 and the rotation distance of the third gear 53 are the same as the rotation distance of the first gear 51.

A gear ratio of the first gear 51 and the fourth gear 54 may be the same as a radius ratio of the first gear 51 and the fourth gear 54. For example, when the radius ratio of the first gear 51 and the fourth gear 54 is 1:4, the gear ratio of the first gear 51 and the fourth gear 54 is 1:4 and the fourth gear 54 rotates 90° when the first gear 51 rotates 360°. The radius of the fourth gear 54 means a distance from the rotation center of the rotating portion 40 to the gear teeth of the fourth gear 54.

The rotation distance of the fourth gear 54 may be the same as the rotation distance of the first gear 51. By the configuration of the gear assembly 50 described above, the rotating portion 40 has the same rotation distance as the roller 20 and may rotate in the same direction as the roller 20.

Figure 4:
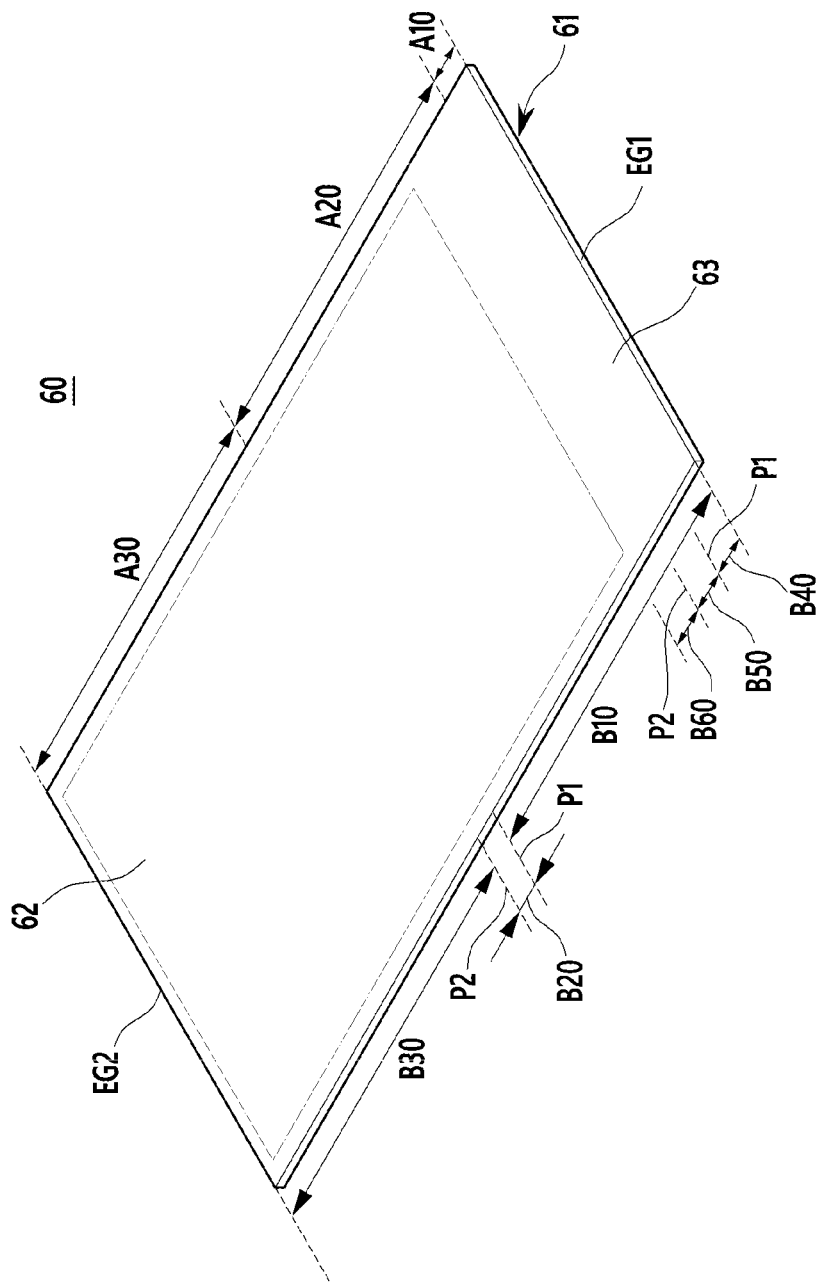
FIG. 4 is a perspective view illustrating an unfolded state of a flexible display panel of the rollable display device illustrated in FIG. 1.

The flexible display panel 60 may be any one of an organic light emitting panel, a liquid crystal panel, an electrophoretic display panel, and an electron ink display panel, which are known. FIG. 4 is a perspective view illustrating an unfolded state of a flexible display panel of the rollable display device illustrated in FIG. 1 and FIG. 5 is a schematic cross-sectional view of the rollable display device illustrated in FIG. 4.

Referring to FIG. 4, the flexible display panel 60 includes a flexible substrate 61 and a display unit 62 positioned on the flexible substrate 61. The display unit 62 may include a plurality of driving circuits and a plurality of pixels and display images. The display unit 62 may contact a dummy unit 63 having no display function. In the dummy unit 63, a plurality of wires transmitting electric signals to the display unit 62, control circuits, and the like may be positioned.

The flexible display panel 60 includes a fixed end EG1 fixed to the roller 20 (see FIG. 2) and a free end EG2 positioned at an opposite side to the fixed end EG1. The fixed end EG1 may be an edge of the dummy unit 63.

Figure 5:
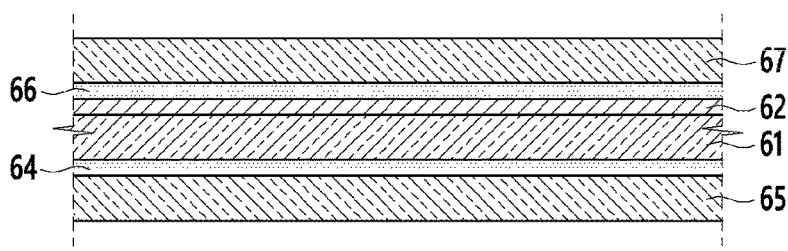
FIG. 5 is a schematic cross-sectional view of the rollable display device illustrated in FIG. 4.

Referring to FIG. 5, the flexible display panel 60 includes a first adhesion layer 64 and a protective film 65 which are positioned below the flexible substrate 61 and a second adhesion layer 66 and a transparent window 67 which are positioned on the display unit 62. The flexible substrate 61, the protective film 65 and the transparent window 67 are fabricated as a plastic film. The display unit 62 may be covered by a thin film encapsulation (not illustrated) and a touch sensor (not illustrated) may be positioned between the display unit 62 and the second adhesion layer 66.

Figure 6:
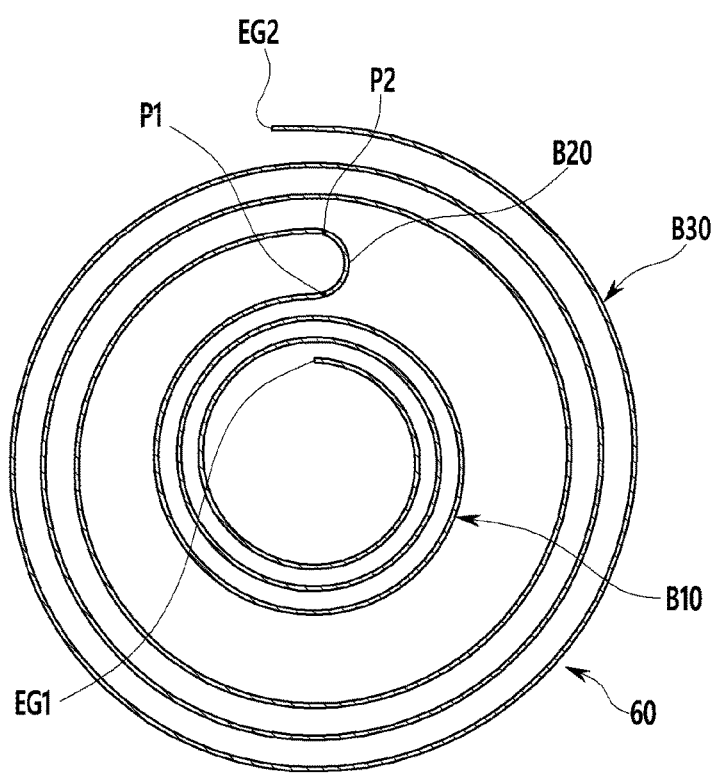
FIG. 6 is a cross-sectional view of the flexible display panel of the rollable display device illustrated in FIG. 2.

FIG. 6 is a cross-sectional view of the flexible display panel of the rollable display device illustrated in FIG. 2.

Referring to FIGS. 2, 4, and 6, the flexible display panel 60 includes a first portion B10 wound in a first direction along the circumferential direction of the roller 20 between the roller 20 and the fixing portion 30, a second portion B20 passing through the first slit SL1, and a third portion B30 wound in a second direction which is opposite to the first direction along the circumferential direction of the fixing portion 30 between the fixing portion 30 and the rotating portion 40.

The first portion B10 is a portion from the fixed end EG1 to a first inflection point P1. The second portion B20 is bent to correspond to a cross-sectional shape of the first slit SL1. The third portion B30 is a portion from a second inflection point P2 to the free end EG2.

When the first direction is a clockwise direction, the second direction is a counterclockwise direction. Meanwhile, when the first direction is a counterclockwise direction, the second direction is a clockwise direction. In FIGS. 2 and 6, a case where the first direction is the clockwise direction and the second direction is the counterclockwise direction is exemplified, but a reverse case is possible.

Figure 7:
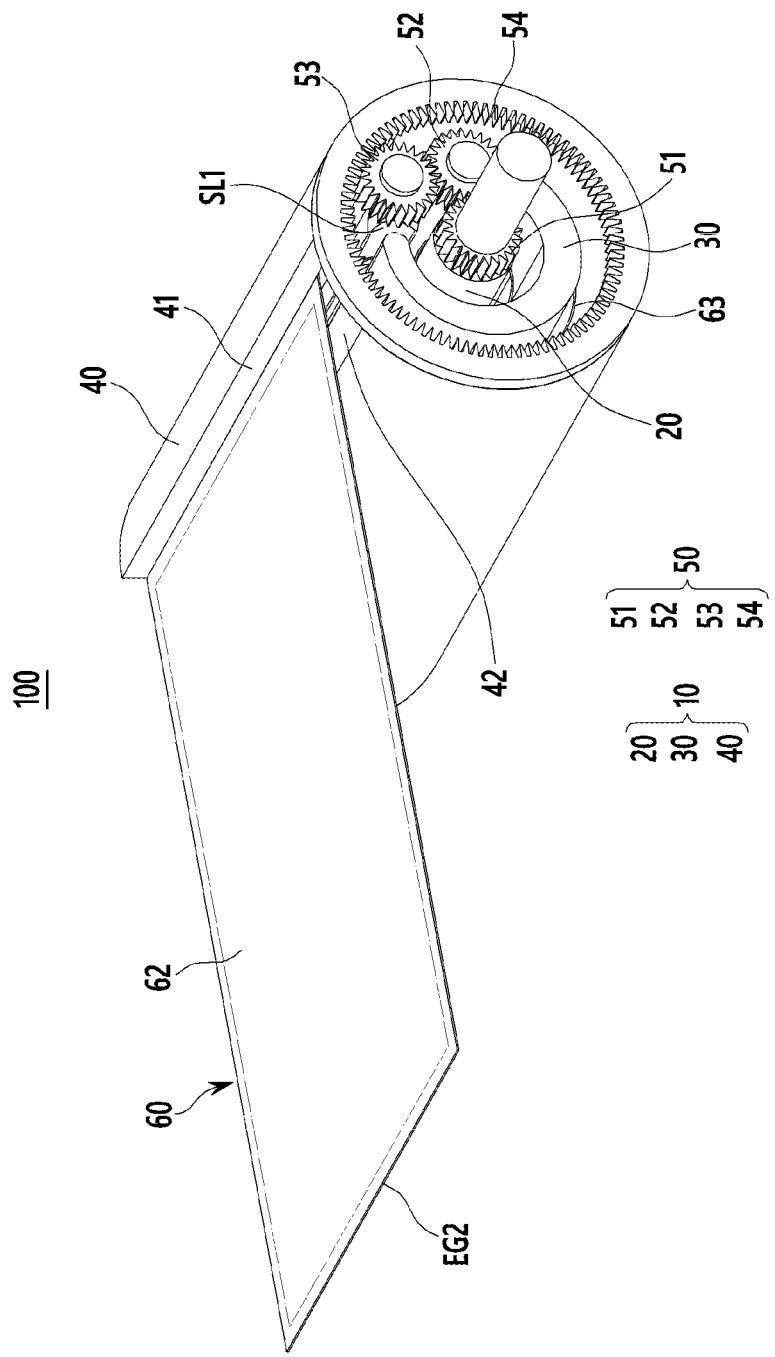
FIG. 7 is a perspective view illustrating an extended mode of the rollable display device according to the first exemplary embodiment.
Figure 8:
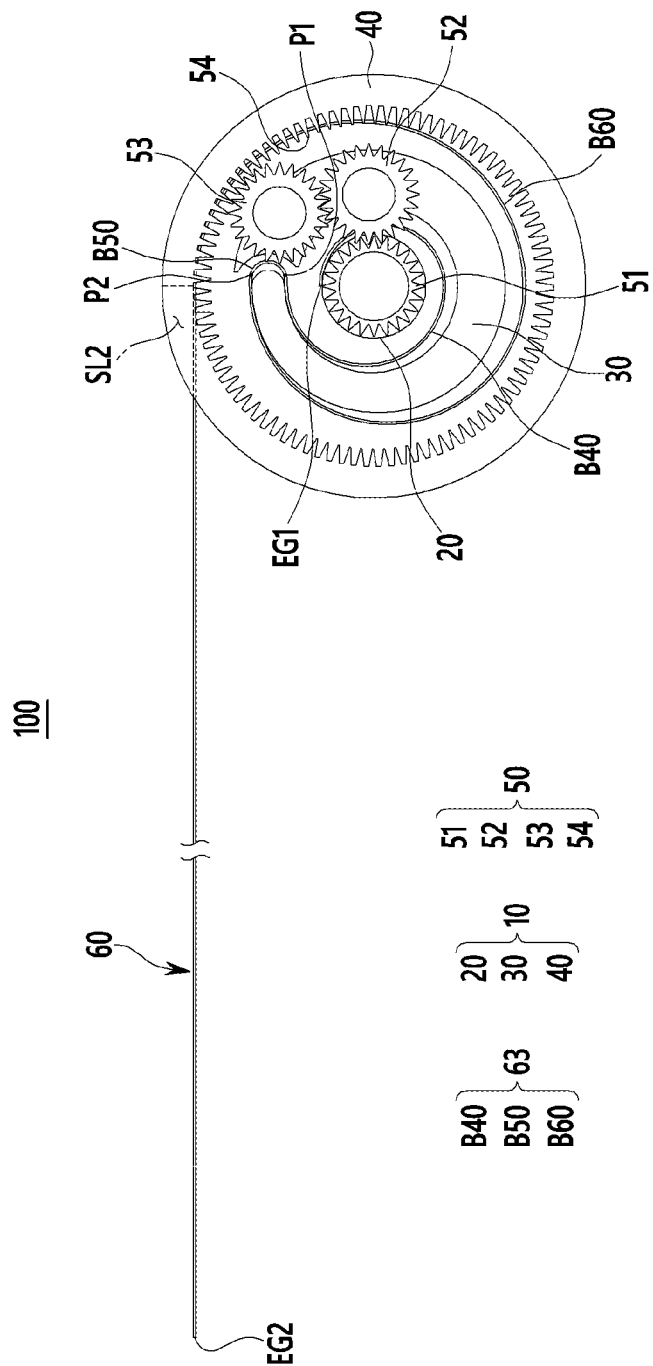
FIG. 8 is a front view of the rollable display device illustrated in FIG. 7.

FIG. 7 is a perspective view illustrating an extended mode of the rollable display device according to the first exemplary embodiment and FIG. 8 is a front view of the rollable display device illustrated in FIG. 7.

Referring to FIGS. 3, 7 and 8, in the received mode, when the roller 20 rotates in the first direction, the gear assembly 50 rotates the rotating portion 40 in the first direction by transferring torque of the roller 20 to the rotating portion 40. While the second slit SL2 rotates in the first direction by rotation of the rotating portion 40, the flexible display panel 60 is unwound to the outside of the rotating portion 40 by the rotation distance of the second slit SL2.

In this case, the thickness T of the fixing portion 30 may be gradually increased toward the second end 32 in the circumferential direction from the first end 31. Then, since a free space is generated between a first cylindrical portion of the third portion B30 wound around the outer surface of the fixing portion 30 and a second cylindrical portion overlapped with the first cylindrical portion, the flexible display panel 60 may be more smoothly slid.

The display unit 62 of the flexible display panel 60 may be drawn out to the outside of the rotating portion 40 and the dummy unit 63 may be accommodated in the rotating potion 40. The state may be defined as an extended mode.

Referring to FIGS. 4 and 8, in the extended mode, the flexible display panel 60 includes a fourth portion B40 wound in a first direction along the circumferential direction of the roller 20 and between the roller 20 and the fixing portion 30, a second portion B20 passing through the first slit SL1, a fifth portion B50 passing through the first slit SL1, and a sixth portion B60 wound in a second direction which is opposite to the first direction along the circumferential direction of the fixing portion 30 between the fixing portion 30 and the rotating portion 40.

The fourth portion B40 is a portion from the fixed end EG1 to a first inflection point P1. The fifth portion B50 is bent to correspond to a cross-sectional shape of the first slit SL1. The sixth portion B60 is a portion from a second inflection point P2 to the free end EG2.

Referring to FIGS. 1 to 8, the flexible display panel 60 includes a first area A10 (see FIG. 4) positioned between roller 20 and the fixing portion 30 of which one end is fixed to the roller 20, a second area A20 (see FIG. 4) positioned to pass through the first slit SL1, and a third area A30 (see FIG. 4) extended from the second area A20. The second area A20 is positioned between the first area A10 and the third area A30.

The first area A10 is an area positioned between the roller 20 and the fixing portion 30 regardless of the unwinding degree of the flexible display panel 60. The first area A10 may be the same as the fourth portion B40 in the extended mode and wound around the roller 20 in the first direction.

The second area A20 is an area which passes through the first slit SL1 of the flexible display panel 60. The second area A20 may be a portion from the first inflection point P1 observed in the extended mode to the second inflection point P2 observed in the received mode.

The first slit may have an arc shape on the cross section and a bending direction of the second area A20 passing through the first slit SL1 may be opposite to a bending direction of the first area A10 based on the first inflection point P1. That is, a winding direction of the flexible display panel 60 may be reversed based on the first inflection point P1.

The third area A30 is an outer area of the second area A20 and may be the same as the third portion B30 observed in the received mode. In the received mode, the third area A30 is wound between the fixing portion 30 and the rotating portion 40 in the second direction which is opposite to the first direction.

The flexible display panel 60 includes the first portion B10 and the third portion B30 which are wound in opposite directions to each other in the received mode. Lengths of the first portion B10 and the third portion B30 may be the same as or similar to each other. The flexible display panel 60 includes the fourth portion 840 and the sixth portion 860 which are wound in opposite directions to each other in the extended mode. Lengths of the fourth portion B40 and the sixth portion B60 may be the same as or similar to each other. As such, the flexible display panel 60 includes two portions which are wound in opposite directions to each other in the roller assembly 10.

Figure 9:
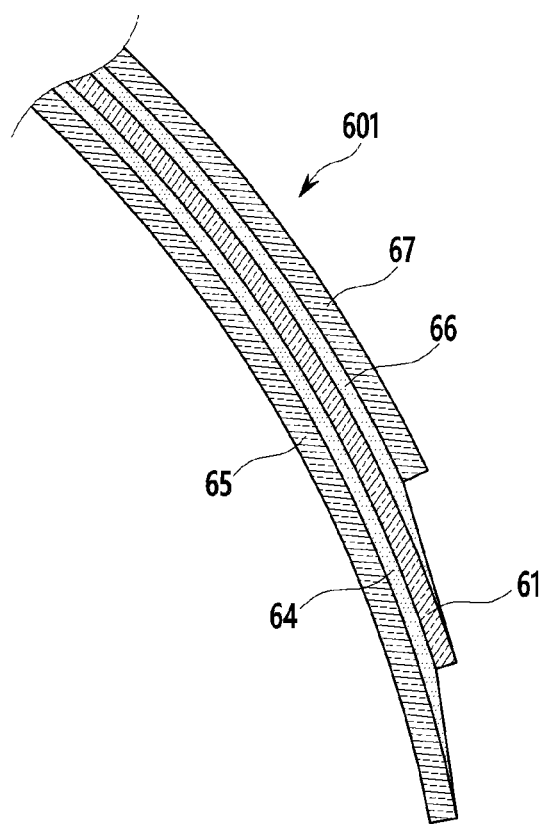
FIG. 9 is a schematic diagram illustrating an end of a flexible display panel in a rollable display device in Comparative Example.

FIG. 9 is a schematic diagram illustrating an end of a flexible display panel in a rollable display device in Comparative Example.

Referring to FIG. 9, when the flexible display panel 601 is wound only in one direction, as the number of winding times is increased, the protective film 65 and the transparent window 67 are pushed from the flexible substrate 61 by deformation of the adhesion layers 64 and 66. In addition, since the pushing is accumulated on the end of the flexible display panel 601, the protective film 65, the flexible substrate 61 and the transparent window 67 are misaligned from each other at the end. In this case, at the end of the flexible display panel 601, defects such as peeling and cracks occur.

However, in the rollable display device 100 of the first exemplary embodiment, since the flexible display panel 60 includes two portions which are wound in opposite directions to each other, at the two portions, relative pushing between the protective film 65 and the transparent window 67 is offset from each other. The two portions are the first portion 810 and the third portion 830 in the received mode and the fourth portion B40 and the sixth portion 860 in the extended mode.

Accordingly, at the fixed end EG1 and the free end EG2 of the flexible display panel 60, a phenomenon in which the protective film 65, the flexible substrate 61 and the transparent window 67 are misaligned from each other does not occur and defects such as peeling and cracks may be prevented.

Figure 10:
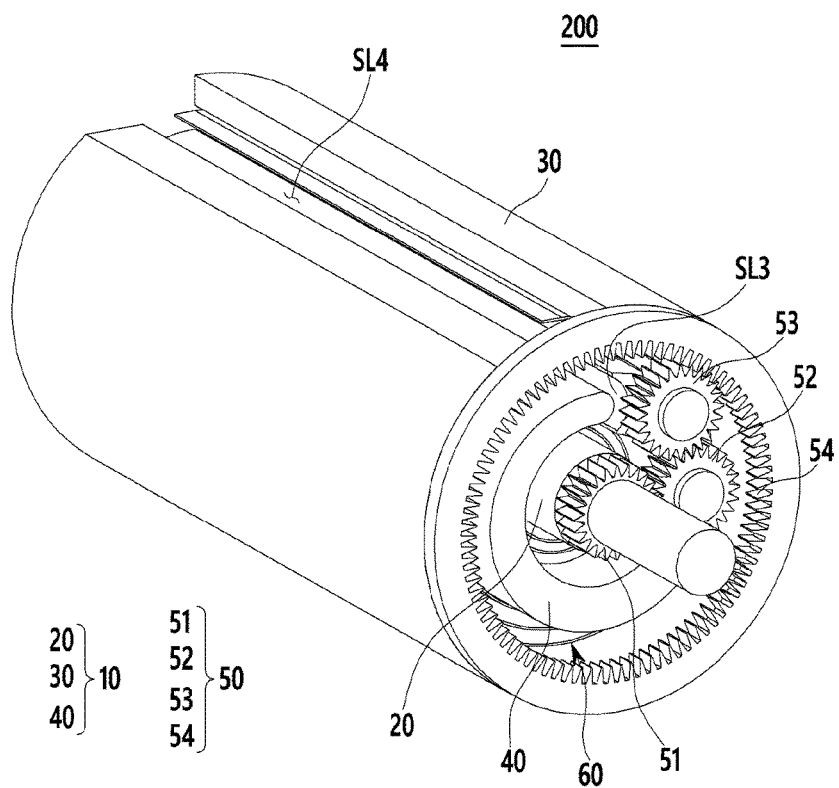
FIG. 10 is a perspective view illustrating a received mode of a rollable display device according to a second exemplary embodiment.
Figure 11:
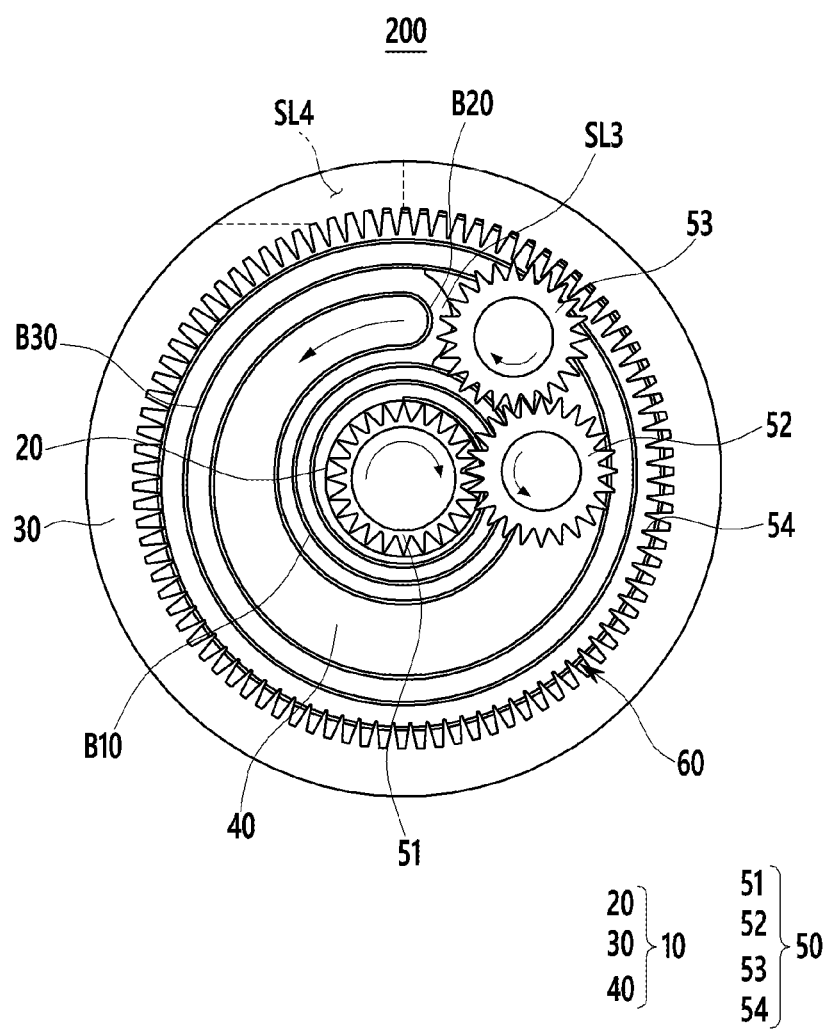
FIG. 11 is a front view of the rollable display device illustrated in FIG. 10.

FIG. 10 is a perspective view illustrating a received mode of a rollable display device according to a second exemplary embodiment and FIG. 11 is a front view of the rollable display device illustrated in FIG. 10.

Referring to FIGS. 10 and 11, in a rollable display device 200 of the second exemplary embodiment, a roller assembly 10 includes a rotatable roller 20, a rotating portion 40 surrounding the roller 20 at a predetermined distance from the roller 20, a fixing portion 30 surrounding the rotating portion 40 at a predetermined distance from the rotating portion 40, and a gear assembly 50 rotating the rotating portion 40 by transferring torque of the roller 20 to the rotating portion 40.

The rotating portion 40 includes a third slit SL3 which is parallel with an axial direction of the roller 20 and has the same shape as the fixing portion of the first exemplary embodiment. However, the rotating portion 40 rotates together with the roller 20 when the roller 20 rotates, unlike the fixing portion of the first exemplary embodiment.

The fixing portion 30 includes a fourth slit SL4 which is parallel with an axial direction of the roller 20 and has the same shape as the rotating portion of the first exemplary embodiment. However, the fixing portion 30 maintains a fixed position, unlike the rotating portion of the first exemplary embodiment. The fourth slit SL4 serves as an outlet of the flexible display panel 60.

The gear assembly 50 is formed by the same configuration as the gear assembly of the first exemplary embodiment. That is, the gear assembly 50 may include a first gear 51 installed on an outer surface of the roller 20, a second gear 52 and a third gear 53 installed in the rotating portion 40, and a fourth gear 54 installed on the inner surface of the fixing portion 30.

When the roller 20 and the first gear 51 rotate in a first direction (for example, a clockwise direction in the drawing) which is a winding direction of the first area A10, the second gear 52 rotates in a second direction and the third gear 53 rotates in the first direction. In this case, since the fourth gear 54 of the fixing portion 30 engaging with the third gear 53 maintains the fixed position, the third gear 53 pushes the rotating portion 40 in the second direction.

Accordingly, while the rotating portion 40 rotates in the second direction which is the opposite direction to the roller 20 and the third slit SL3 moves in the second direction by rotation of the rotating portion 40, the flexible display panel 60 is unwound by the rotation distance of the third slit SL3. The flexible display panel 60 is unwound outside the fixing portion 30 through the fourth slit SL4 of the fixing portion 30.

In the extended mode, the entire display unit 62 is positioned outside the fixing portion 30. In the extended mode, when the roller 20 rotates in the second direction, the flexible display panel 60 is wound around the roller 20 and the rotating portion 40 in the opposite process described above, and the rollable display device 200 is shifted to the received mode.

The fixing portion 30 of the first exemplary embodiment and the rotating portion 40 of the second exemplary embodiment are first receiving portions surrounding the roller 20. In addition, the rotating portion 40 of the first exemplary embodiment and the fixing portion 30 of the second exemplary embodiment are second receiving portions surrounding the first receiving portions. The first receiving portion and the second receiving portion are referred to as the fixing portions 30 when maintaining the fixed positions and referred to as the rotating portions 40 when rotating together with the roller 20.

The flexible display panel 60 includes a first area A10 positioned between the roller 20 and the first receiving portion of which one end is fixed to the roller 20, a second area A20 which is a passable area of the fifth slit which is positioned to pass through the fifth slit, and a third area A30 extended from the second area A20. In the first exemplary embodiment, the fifth slit and the sixth slit are first slit SL1 and the second slit SL2, respectively, and in the second exemplary embodiment, the fifth slit and the sixth slit are the third slit SL3 and the fourth slit SL4, respectively.

The flexible display panel 60 is unwound outside the second receiving portion through the sixth slit of the second receiving portion or wound around the roller 20 and the first receiving portion by moving into the second receiving portion.

Figure 12A:
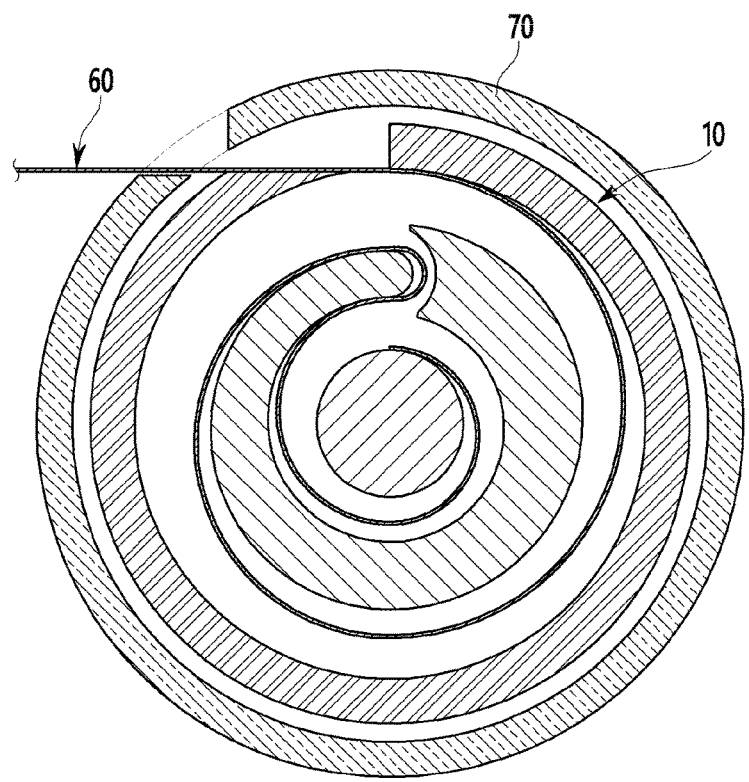
FIGS. 12A, 12B and 12C are cross-sectional views of the rollable display device including a housing.
Figure 12B:
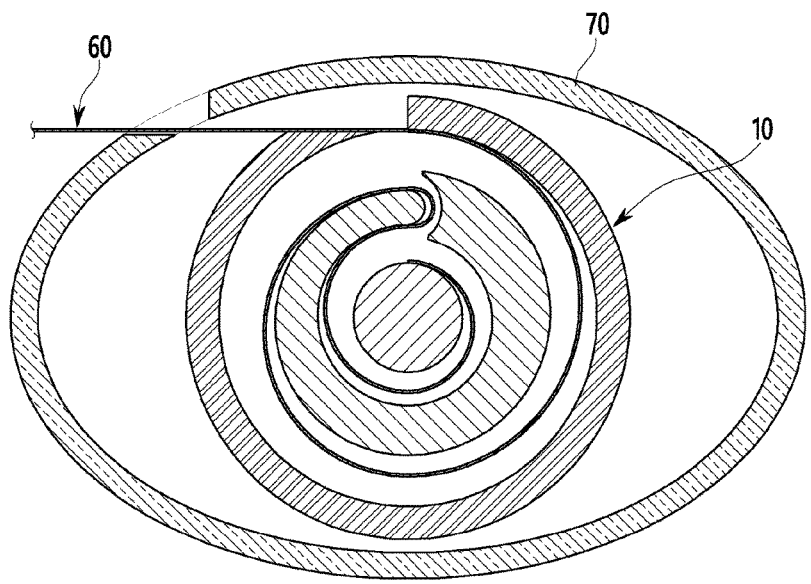
Figure 12C:
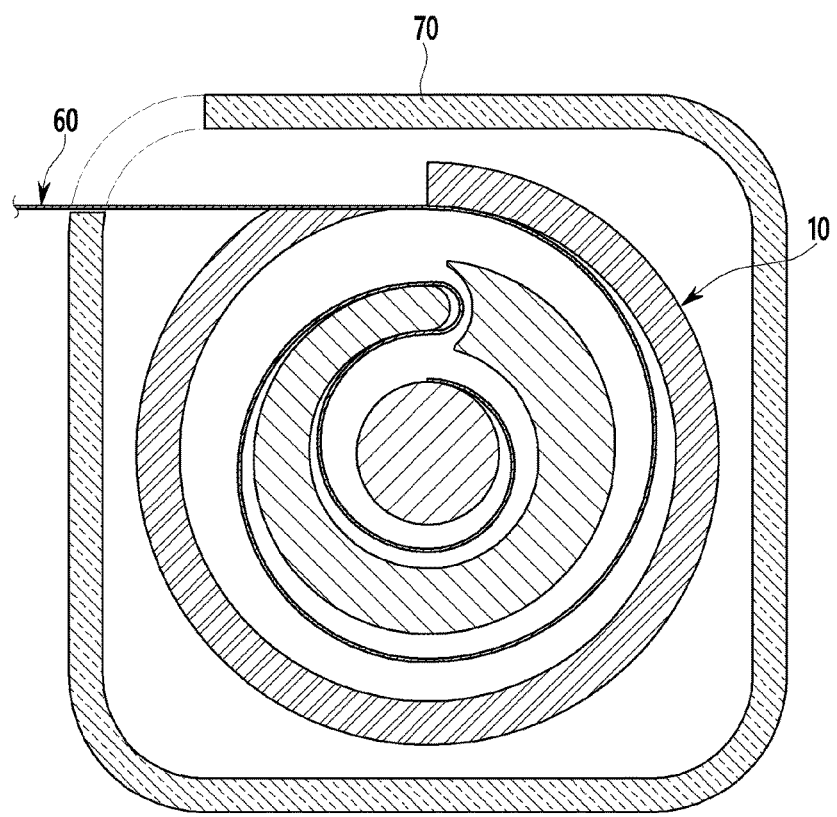

In the rollable display devices 100 and 200 of the first exemplary embodiment and the second exemplary embodiment, the roller assembly 10 may be surrounded by a housing. FIGS. 12A, 12B and 12C are cross-sectional views of the rollable display device including a housing. Referring to FIGS. 12A to 12C, a housing 70 may have a cross-sectional shape such as a circle, an oval, or a quadrangle. The cross-sectional shape of the housing 70 is not limited thereto and may be variously modified.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A rollable display device, comprising:
a roller configured to be rotatable;
a fixing portion surrounding the roller and including a first slit;
a rotating portion surrounding the fixing portion and including a second slit;
a gear assembly including a plurality of gears installed in the roller, the fixing portion, and the rotating portion, wherein the plurality of gears is configured to transfer torque of the roller to the rotating portion; and
a flexible display panel including a first area positioned between the roller and the fixing portion of which one end is fixed to the roller, a second area positioned to pass through the first slit, and a third area extended from the second area.

2. The rollable display device of claim 1, wherein:
the first area is wound around the roller in a first direction,
the first slit has an arc shape on a cross section, and
a bending direction of the second area passing through the first slit is opposite to a bending direction of the first area based on a first inflection point.

3. The rollable display device of claim 2, wherein:
in a received mode in which the flexible display panel is received in the rotating portion, the third area is wound between the fixing portion and the rotating portion in a second direction that is opposite to the first direction.

4. The rollable display device of claim 2, wherein:
the fixing portion includes a first end that is convex and a second end that is concave, the second end facing the first end with the first slit interposed therebetween on the cross section, and
a thickness of the fixing portion measured on the cross section is gradually increased toward the second end in a circumferential direction from the first end.

5. The rollable display device of claim 1, wherein:
a rotation direction of the rotating portion is the same as a rotation direction of the roller, and
a rotation distance of the rotating portion is the same as a rotation distance of the roller.

6. The rollable display device of claim 5, wherein:
the gear assembly includes
a first gear formed on an outer surface of the roller in a circumferential direction of the roller,
a second gear installed in the fixing portion and engaging with the first gear,
a third gear installed in the fixing portion and engaging with the second gear, and
a fourth gear formed on an inner surface of the rotating portion in a circumferential direction of the rotating portion and engaging with the third gear.

7. The rollable display device of claim 6, wherein:
a gear ratio of the first gear and the second gear is 1:1,
a gear ratio of the second gear and the third gear is 1:1, and
a gear ratio of the first gear and the fourth gear is the same as a radius ratio of the first gear and the fourth gear.

8. A rollable display device, comprising:
a rotatable roller;
a rotating portion surrounding the roller and including a third slit;
a fixing portion surrounding the rotating portion and including a fourth slit;
a gear assembly including a plurality of gears installed in the roller, the rotating portion and the fixing portion, wherein the plurality of gears is configured to transfer torque of the roller to the rotating portion; and
a flexible display panel including a first area positioned between the roller and the rotating portion of which one end is fixed to the roller, a second area positioned to pass through the third slit, and a third area extended from the second area.

9. The rollable display device of claim 8, wherein:
the first area is wound around the roller in a first direction,
the third slit has an arc shape on a cross section, and
a bending direction of the second area passing through the third slit is opposite to a bending direction of the first area based on a first inflection point.

10. The rollable display device of claim 9, wherein:
in a received mode in which the flexible display panel is received in the fixing portion, the third area is wound between the rotating portion and the fixing portion in a second direction that is opposite to the first direction.

11. The rollable display device of claim 9, wherein:
the rotating portion includes a first end that is convex and a second end that is concave, the second end facing the first end with the third slit interposed therebetween on the cross section, and
a thickness of the rotating portion measured on the cross section is gradually increased toward the second end in a circumferential direction from the first end.

12. The rollable display device of claim 8, wherein:
a rotation direction of the rotating portion is opposite to a rotation direction of the roller, and
a rotation distance of the rotating portion is the same as a rotation distance of the roller.

13. The rollable display device of claim 12, wherein the gear assembly includes:
a first gear formed on an outer surface of the roller in a circumferential direction of the roller,
a second gear installed in the rotating portion and engaging with the first gear,
a third gear installed in the rotating portion and engaging with the second gear, and
a fourth gear formed on an inner surface of the fixing portion in a circumferential direction of the fixing portion and engaging with the third gear.

14. The rollable display device of claim 13, wherein:
a gear ratio of the first gear and the second gear is 1:1,
a gear ratio of the second gear and the third gear is 1:1, and
a gear ratio of the first gear and the fourth gear is the same as a radius ratio of the first gear and the fourth gear.

15. A rollable display device, comprising:
a rotatable roller;
a first receiving portion surrounding the roller and including a fifth slit;
a second receiving portion surrounding the first receiving portion and including a sixth slit;
a gear assembly including a plurality of gears installed in the roller, the first receiving portion and the second receiving portion, wherein the plurality of gears is configured to transfer torque of the roller to any one of the first receiving portion and the second receiving portion; and
a flexible display panel including a first area positioned between the roller and the first receiving portion of which one end is fixed to the roller, a second area positioned to pass through the fifth slit, and a third area extended from the second area.

16. The rollable display device of claim 15, wherein:
the first area is wound around the roller in a first direction,
the fifth slit has an arc shape on a cross section, and
a bending direction of the second area passing through the fifth slit is opposite to a bending direction of the first area based on a first inflection point.

17. The rollable display device of claim 16, wherein:
in a received mode in which the flexible display panel is received in the second receiving portion, the third area is wound between the first receiving portion and the second receiving portion in a second direction which is opposite to the first direction.

18. The rollable display device of claim 16, wherein:
the first receiving portion includes a first end that is convex and a second end that is concave, the second end facing the first end with the fifth slit interposed therebetween on the cross section, and
a thickness of the first receiving portion measured on the cross section is gradually increased toward the second end in a circumferential direction from the first end.

19. The rollable display device of claim 15, wherein:
the first receiving portion is configured to maintain a fixed position,
the gear assembly is configured to transfer torque of the roller to the second receiving portion, and
a rotation direction of the second receiving portion is the same as a rotation direction of the roller.

20. The rollable display device of claim 15, wherein:
the second receiving portion is configured to maintain a fixed position, the gear assembly is configured to transfer torque of the roller to the first receiving portion, and
a rotation direction of the first receiving portion is opposite to a rotation direction of the roller.

* * * * *